United States Patent [19]

Birkmire et al.

[11] Patent Number: 4,909,863
[45] Date of Patent: Mar. 20, 1990

[54] PROCESS FOR LEVELLING FILM SURFACES AND PRODUCTS THEREOF

[75] Inventors: Robert W. Birkmire; Brian E. McCandless, both of Newark, Del.

[73] Assignee: University of Delaware, Newark, Del.

[21] Appl. No.: 218,758

[22] Filed: Jul. 13, 1988

[51] Int. Cl.⁴ .................. H01L 21/00; H01L 21/02; H01L 21/30; H01L 21/304
[52] U.S. Cl. .................. 148/33.4; 437/228; 437/233; 437/234; 437/225; 148/DIG. 51; 156/625; 156/662; 136/258; 136/264; 136/265
[58] Field of Search ............. 437/225, 228, 233, 234; 148/DIG. 51; 156/625, 662; 136/258, 264, 265

[56] References Cited

U.S. PATENT DOCUMENTS 4,536,607  8/1985  Wiesman ........................... 136/249

FOREIGN PATENT DOCUMENTS 0237732  7/1986  German Democratic Rep.
0238286  8/1986  German Democratic Rep.
0132621  6/1986  Japan.
0176122  8/1986  Japan.

OTHER PUBLICATIONS

S. Wagner, J. L. Shay, P. Migliorato, H. M. Kasper; "CuInSe$_2$/Cds Heterojunction Photovoltaic Detectors," *Appl. Phys. Letters*, 25, 434–435 (1974).
B. Tell, M. Bridgenbaugh; "Photovoltaic Properties and Junction Formation of CuInSe$_2$", *Jrnl. of Applied Physics*, 48, 2477–2480 (1977).
L. L. Kazmerski, O. Jamjoun, P. J. Ireland, S. K. Deb, R. A. Mickelsen, W. Chen; "Initial Oxidation of CuInSe$_2$" *J. Vac. Sci. Technol.*, 19 (1981).
R. R. Arya, T. Warminski, R. Beaulieu, M. Kwietniak, J. J. Loferski; "Photovoltaic & Structural Properties of CuInSe$_2$/CdS Solar Cells" *Solar Energy Mtrls.* 8 (1983) 471–481.
D. K. Rao, J. J. B. Prasad, D. Sridevi, K. V. Reddy, J. Sobhanadri; *Properties of p-CuInSe$_2$/Al Schottky Devices* (1985) K-153-K158.
W. Shen, W. Siripala, M. Tomkiewicz: "Electrolyte Electroreflectance Study of Surface Optimization of n-CuInSe$_2$ in Photoelectrochemical Solar Cells" *J. Electrochem. Soc.* (1986) 107–111.
N. Yalcin, I. S. Al-Saffar, R. D. Tomlinson; "Space-charge-limited current effects in n-type CuInSe$_2$/Au Schottky diodes" *J. Appl. Phys.* 52 (1981) 5857–5858.
R. W. Birkmire, L. C. DiNetta, P. G. Lasswell, J. D. Meakin, J. E. Phillips, "High Efficiency CuInSe$_2$ Based Heterojunction Solar Cells: Fabrication and Results" *Solar Cells* 16 (1986).
Y. Mirovsky, D. Cahen; "n-CuInSe$_2$/polysulfide photoelectrochemical Solar Cells" *Applied Physics Ltrs.*, vol. 40, No. 8, 727–730 (1982).
D. Cahen, G. Dagan, Y. Mirovsky; "Termary Chalcogenide-Based Photoelectrochemical Cells" *J. Electrochem. Soc.* (1985) 1062–1070.
H. Haupt, K. Hess; "Growth of Large CuInSe$_2$ Single Crystals" *Inst. Phys. Conf.* S. N. 35, 5–12 (1977).
Yakushev, M., The Observ. of Near-Surface Deviat. from Stoich. in CuInSe$_2$ Cryst. follow Chem. Etch., *Sol. Stat. Commun.*, 65, pp. 1079–1083, 1988.
Cahen, D., X-Ray Photoelect. & Auger Electron Spectro. Anal. of Surface Treatments and Electrochem. Decompos. of CuInSe$_2$ Photoelectrodes, *J. Appl. Phys.* 57, pp. 4761–4771, 1985.
Dagan, G., Select. Electrochem. Etching of P-CuInSe$_2$, Materials Research Society, pp. 133–138, 1987.
Birkmire, R., Specular CuInSe$_2$ Films for Solar Cells, *Appl. Phys. Lett.* 53(2), 1988.

Primary Examiner—Brian E. Hearn
Assistant Examiner—B. Everhart
Attorney, Agent, or Firm—James H. Ryan

[57] ABSTRACT

Semiconductor films and photovoltaic devices prepared therefrom are provided wherein the semiconductor films have a specular surface with a texture less than about 0.25 micron greater than the average planar film surface and wherein the semiconductor films are surface modified by exposing the surface to an aqueous solution of bromine containing an acid or salt and continuing such exposure for a time sufficient to etch the surface.

39 Claims, 2 Drawing Sheets

PROCESS FOR LEVELLING FILM SURFACES AND PRODUCTS THEREOF

The U.S. government has rights in this invention pursuant to subcontract No. XL-7-06031-5 awarded by the Solar Energy Research Institute under United States Department of Energy prime contract number DE-AC02-83CH10093.

BACKGROUND OF THE INVENTION

This invention relates to a controllable aqueous polishing technique for levelling the surface of films, particularly polycrystalline thin films and more particularly, semiconductors, and to products prepared therefrom.

As-grown semiconductor films such as, for example, $CuInSe_2$ films, are particularly useful for producing p-n junction photovoltaic detectors, light-emitting diodes, heterojunction detectors, infrared detectors, solar cells and the like. A ternary chalcopyrite-type semiconductor such as $CuInSe_2$ is particularly suited for use in photovoltaic devices such as single junction cells and its band gap is near optimum for tandem cells. Indeed, $CuInSe_2$ has a direct band gap and one of the highest measured absorption coefficients in a semiconductor, minimizing the requirement for minority carrier diffusion length and related materials utilization. The electron affinity difference between $CuInSe_2$ and CdS appears to be small, providing no interfacial conduction band spikes, and electrical properties can be varied widely both by doping and stoichiometry control. Solar cells prepared from $CuInSe_2$ films are more particularly described by Birkmire et al. in *High Efficiency CuInSe₂ Based Heterojunction Solar Cells: Fabrication and Results*, Solar Cells, 16, 419–427 (1986), incorporated herein by reference.

However, it has not been possible to grow a smooth film of a ternary chalcopyrite-type semiconductor such as $CuInSe_2$ which has the required electro-optical properties for producing high conversion efficiency solar cells, particularly monolithic tandem cells. As-grown $CuInSe_2$ films which have the necessary electro-optical properties for device applications, nominally those films about two to three microns in thickness, exhibit surface texture (growth facets and protrusions) in the 1 to 5 micron range. This was also observed by Arya et al during their investigation of $CuInSe_2$ surface morphology and stoichiometry as reported in *Photovoltaic and Structural Properties of CuInSe₂/Cds Solar Cells*, Solar Energy Materials, 8, 471–481 (1983). The surface of $CuInSe_2$ crystals contained so many microcracks and other non-uniformities that a device having an active area of 4.2 mm2 was reduced to 0.8 mm2 to eliminate regions with visible microcracks and low response.

In one application, $CuInSe_2$ thin films are used in the production of monolithic tandem cells, wherein the $CuInSe_2$/CdS cell is combined with a wide bandgap cell such as CdTe/CdS or amorphous silicon. The $CuInSe_2$/CdS cell utilizes photons which are transmitted through the wide bandgap cell. In such a structure, the $CuInSe_2$/CdS cell serves as the substrate onto which the wide bandgap cell is fabricated. Because the second cell in a typical monolithic tandem cell construction (e.g. $CuInSe_2$/CdS/a-Si:H) mimes the surface texture of the base layer, the protrusions of the first layer are also present in the surface of the second. Accordingly, the very thin amorphous silicon top layer deposited on the second layer may be even thinner where it covers the protrusions in the surface below it. Consequently, such cells short on use and have low open circuit voltages. Thus protrusions, and irregularities in the as-grown surface result in product non-uniformity, low yield, and increased materials expense to insure adequate thickness in subsequently deposited layers to carry current and obviate breakdowns through shorting, particularly in tandem cells.

Several different kinds of surface treatment have been suggested for overcoming the problems posed by the rough surface of semiconductor films such as $CuInSe_2$ films. Generally recommended surface treatments, including chemical etching, mechanical polishing, thermal oxidation, electrochemical oxidation, photoelectrochemical etching, air oxidation, and the like and their various recommended combinations, all have significant disadvantages, not least of which is the depletion of one or more film components, particularly in the near-surface area, and the degradation of physical and electro-optical properties.

Of the treatments suggested, the most practical surface modification method from a commercial standpoint for most applications would be chemical etching. Yakushev et al., *The Observation of Near-Surface Deviations from Stoichiometry in CuInSe₂ Crystals Following Chemical Etching*, Solid State Communications, Vol. 65, No. 10, pp 1079–1083 (1988) studied the effect of chemical etchants employed for this purpose. They reported that significant near-surface composition changes which significantly affect the physical characteristics of the compound and the electro-optical properties of any device fabricated from it were observed with all etchants studied including 1:1 $HCl:HNO_3$, 1:3 $HF:HNO_3$, $H_2SO_4:K_2Cr_2O_7$, and bromine in methanol. However, they noted that while very dilute solutions of potassium dichromate and sulfuric acid and very dilute solutions of bromine in methanol did not produce such significant changes, Cahen et al reported (*J. Appl. Phys.*, 57, 4761 (1985)) that the use of bromine in methanol results in a copper-depleted surface and this result, which appears to be well known, was also reported by Arya et al.

As a practical matter, the use of a bromine/methanol etchant is further disadvantageous because the methanol tends to dissolve materials such as the resists used in lithographic and other semiconductor film processing techniques. This is particularly significant in the production of photovoltaic devices such as tandem cells, single junction cells, or any other devices which depend on smooth surfaced, uniformly layered films for operability. It has simply not been possible heretofore to remove large scale surface defects chemically and provide a specular finish on a semiconductor film such as $CuInSe_2$ in a single step, without altering the stoichiometry of the film surface, and without degrading the electro-optical properties of the film and/or any device prepared therefrom.

SUMMARY OF THE INVENTION

It has now been found that as-grown polycrystalline films that are devoid of the foregoing disadvantages and that have a specular surface can be produced by exposing the polycrystalline film surface to an aqueous solution of bromine and an acid or salt of an alkali metal, alkaline earth metal, or heavy metal, or mixture thereof, and continuing such exposure for a time sufficient to polish the surface of the film.

Although any concentration of bromine effective to etch the surface of a polycrystalline thin film can be used in the aqueous solution or treating medium, from about 0.02 mol/l to saturation is preferred and from about 0.02 to 0.25 mol/l is most preferred. Likewise any concentration of the acid or salt effective to polish the surface of the film in conjunction with the bromine can be used, but preferably at least about 0.01 mol/l of acid or salt or mixture thereof is used, more preferably from about 0.05 mol/l to saturation, and most preferably from about 0.05 mol/l to 0.15 mol/l. Preferably, the aqueous solution or treatment medium has a pH of about 9.5 or less most preferably from about 7 to 2.5.

Since the instant technique for chemically smoothing semiconductor film surfaces does not change film properties, even when the aqueous medium contains high concentrations of bromine, any amount of bromine and the acid or salt can be used depending on the speed-/economy desired in the surface treatment.

The invention also provides unique polycrystalline thin films having a specular surface in which the texture (surface protrusions) is less than 0.25 micron greater than the average planar film surface, and photovoltaic devices produced therefrom, particularly single junction and monolithic tandem cells.

DETAILED DESCRIPTION OF THE INVENTION

The invention is applicable to polycrystalline thin films, and cross-sections taken from polycrystalline wafers generally but is described herein with particular reference to $CuInSe_2$ semiconductor films which are preferred because they are particularly useful for the production of photovoltaic devices. It is to be understood, however, that the invention is equally applicable to other ternary as well as binary and multinary films such as, for example, films of materials in the I-III-VI, III-V, II-V, and II-VI compound semiconductor groups and mixtures thereof and to opto-electronic devices produced therefrom. Exemplary films include CdTe, ZnTe, $Zn_3P_2$, GaAs, $CuInS_2$, $AgInTe_2$, $Cu(In_y Ga_{1-y})Se_2$, CdSe, and the like.

Figure 1:
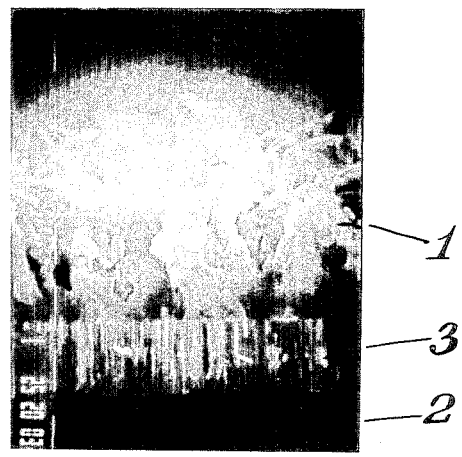
FIG. 1 is a scanning electron micrograph (SEM) of a cross-section of an as-grown $CuInSe_2$ polycrystalline film 1 on a glass substrate 2 containing a molybdenum coating 3.
Figure 2:
FIG. 2 is an SEM cross-section and partial planar view of the film of FIG. 1 after surface modification at room temperature for a time sufficient to remove one micron of effective as-grown film thickness with a solution of prepared by adding 0.02 mol/l bromine to methanol.
Figure 3:
FIG. 3 is an SEM of the film of FIG. 2 showing the edge only.
Figure 4:
FIG. 4 is an SEM cross-section and partial planar view of the film of FIG. 1 after surface modification at room temperature for a time sufficient to remove one micron of effective as-grown film thickness with a solution prepared by adding 0.02 mol/l bromine and 0.13 mol/l KBr to water.
Figure 5:
FIG. 5 is an SEM of the film of FIG. 4 showing the edge only.

With respect to the figures, scale is indicated in FIGS. 1–5 by the perpendicular white lines on the left which are each one micron in length. FIGS. 4 and 5 show dramatically the effect achieved by the practice of the invention, particularly compared against FIGS. 2 and 3 which show the results obtained when a bromine/methanol etchant is used. Although in each case one micron of effective film thickness was removed, FIG. 2 shows that the methanol solution etched the as-grown film surface but did not remove the surface protrusions even non-preferentially. In fact, the bromine/methanol etchant merely reduced the thickness of the film without significantly diminishing the relative ratio of protrusion to average surface thickness.

By contrast, FIG. 3 shows that the surface of the film modified in accordance with the invention is smooth. A comparison of FIG. 5 against FIG. 3 confirms the fact that the instant invention removes protrusions preferentially. That is, the etchant of the invention is selective with respect to the surface. As a result the etchant of the invention removes the protrusions more quickly than the base film and provides a texture (average protrusion level) less than 0.25 micron greater than the average planar surface of the treated film. Consequently, the treated films of the invention have a specular surface.

In fact, films which have been surface-modified in accordance with the invention (FIGS. 4 and 5) exhibit a total optical reflection of greater than about 18% which approaches the theoretical of about 24% for a specular $CuInSe_2$ film. By contrast, as-deposited films as shown in FIG. 1 have been found to have a total reflection of light in the wave-length range of 0.4 to 1.4 nm from the surface of about 5%.

Another advantage of the aqueous based etchants of the invention over methanol based etchants resides in the fact that the aqueous solutions are compatible with both positive and negative photoresists used in lithographic processing. It is unexpected that bromine can be dissolved easily in water at concentrations that provide appreciable etch rates as is the case when the aqueous medium of the invention contains the acid or salt of the invention when the bromine is being dissolved therein.

Any amount of bromine effective to etch the surface of a polycrystalline film and any amount of the acid or salt effective to transform the bromine etchant into a polishing agent can be used in accordance with the invention. While the operation of the invention is not understood, bromine in water did not polish the surface of a polycrystalline film but acted as an etchant to provide a modified but still very rough surface. On the other hand, an acid or salt of the invention in water had no effect on a polycrystalline surface whatsoever. However, when bromine was used together with the acid or salt, the solution was transformed from a etchant into a polishing agent and provided a specular surface on polycrystalline films in accordance with the invention. Any quantity from the smallest quantities of bromine with similarly small quantities of the acid or salt or their mixtures up to and including saturation quantities thereof provide the unique results of the invention. The quantity of bromine controls the rate at which material is removed from the surface.

It has also been found that the substitution of iodine for bromine in solutions of the invention is ineffective and that such solutions do not provide the polishing action of the bromine-containing solutions described herein.

Because the chemistry of bromine is quite complex and influenced by many factors, it is impossible to predict with certainty exactly what relative concentrations of bromide, hydrobromous acid, and other ions exist in aqueous solution at any given time. Accordingly, the concentrations as discussed herein refer to those quantities which are placed in aqueous solution initially without regard to the relative concentrations of the components once they ionize and interact.

Any suitable acid or salt or mixture of any of them, including mixtures of acids and salts, which will activate bromine in accordance with the invention can be used in the aqueous surface modifying solution. Hydrochloric and hydrobromic acids and alkali metal and alkaline earth metal bromine and chlorine containing salts are preferred. Other acids which can be used include sulfuric, acetic, oxalic, citric, uric, sulfuric, nitric, phosphoric, and the like, hydrates thereof and the like, and mixtures thereof. Other suitable salts include ammonium salts such as ammonium chloride, ammonium bromide, alkali metal and alkaline earth metal salts as well as heavy metal salts of chlorine, bromine, and chlorine and bromine-containing radicals, including chlorides, bromides, chlorates, bromates, hypochlorites, hypobromites, and the like and mixtures of any them. Specific examples of some such suitable materials include KBr, KCl, NaBr, NaCl, LiBr, $CaBr_2$, $NaBrO_3$, $CsCl_2.6H_2O$, $MgBr_2$, $FeCl_3.6H_2O$, $Na_2SO_4.10H_2O$, $LiClO_3$, LiCl, $MgCl_2$, KClO, $ZnCl_2$, $CdCl_2$, corresponding iron, nickel, manganese, cobalt and the like salts and mixtures thereof. Salts of chlorine and bromine-containing radicals as described herein and hydrates thereof can also be employed and the like and mixtures thereof, KBr is most preferred.

Deionized water is preferred for the aqueous medium only because contamination can thus be more readily controlled. Tap water, rain water, or any other aqueous medium can be used just as well. The aqueous medium can contain any desired additives and adjuvants which will not block the surface modification treatment of the invention. Since the surface modification reaction of the invention is highly efficient and proceeds expeditiously, even those additives and adjuvants which slow the reaction may be employed if desired. Any suitable surfactants, pigments, dyes, plasticizers, or any other additives known in the art may be used. Because the process of the invention can be carried out at a pH greater than 7, provided that the aqueous solution contains an effective amount of bromine and the acid or salt or mixtures thereof to polish the film surface as described herein, additives and adjuvants which lack a pH greater than 7 may be used including bases per se (e.g., NaOH, KOH, $NH_4OH$) whether organic or inorganic.

The semiconductor film can be exposed to the aqueous surface-modifying solution by any suitable method including immersion in a bath in any suitable container, spraying, or by any other suitable method desired or convenient. Aerosol or stream spraying supplies constant replenishment of the etchant and carries off any effluent that might form.

Following exposure to the aqueous surface-modifying solution, the semiconductor surface is preferably rinsed with any suitable solvent such as de-ionized water. The rinse should be of a time suitable to completely remove residual reactants and by-products, preferably 10 to 60 seconds.

The surface modification reaction of the invention can be carried out under ambient conditions or at elevated or reduced temperatures and pressures as desired for any suitable length of time dictated only by the degree of etching desired. Because the process of the invention is readily controlled, one can easily monitor the etching process by measuring the thickness of the film periodically and removing the film from exposure to the treating solution when the desired quantity of film surface has been removed, preferably from about 0.1 to 1.5 microns. The process of the invention is also useful for chemically thinning or uniformly reducing the thickness of semiconductor films by any amount desired.

$CuInSe_2$ film deposited by any means including physical vapor deposition, for example, as described by Birkmire et al. in *High Efficiency $CuInSe_2$ Based Heterojunction Solar Cells: Fabrication and Results,* Solar Cells, 16, 419–427 (1986), contains growth facets and protrusions in the 1 to 5 micron range. Using the process of the invention, a monolithic tandem cell can be prepared which is uniform throughout as demonstrated by removing from 3% to 50% or more of the as-deposited film using the process of the invention. Table 1 shows the highest cell parameters measured at ELH 87.5 $mW/cm^2$ at 32° C. The open circuit voltage is comparable to or is slightly higher than those measured on cells prepared on as-deposited $CuInSe_2$ films. The short circuit currents are lower and the light generated circuits, J1, when corrected for observed increased reflection, are comparable to those for cells prepared using as-deposited $CuInSe_2$ films. Thus, the bulk generation and collection properties of the $CuInSe_2$ films must be uniform, even though the components of the film are deposited in layers, since more than 50% of the film can be removed without affecting the light generated current. The efficiency of the best photovoltaic device on etched $CuInSe_2$ was greater than 9%.

TABLE 1

| Cell Parameters for $CuInSe_2$/CdZnS Devices | | | |
|---|---|---|---|
| Voc (V) | Jac ($mA/cm^2$) | FF (%) | Thickness of $CuInSe_2$ removed (microns) |
| 0.39–0.43 | 33.6–34.4 | 63.2–67.2 | 0 |
| 0.431 | 31.4 | 60.6 | 0.4 |
| 0.415 | 29.5 | 64.6 | 1.0 |
| 0.400 | 29.5 | 50.1 | 1.5 |
| 0.410 | 30.0 | 58.6 | 2.0 |

Auger electron spectroscopy, energy dispersive x-ray spectroscopy, and x-ray diffraction studies show that the surface stoichiometry and structure remained unchanged after surface modification in accordance with the invention. The structural and electronic properties of the bulk films are also unaffected by the instant process and no chemical residues are deposited on the film surface as a result of the present technique.

The aqueous solution of the invention can be prepared by any suitable method including bubbling or sparging bromine gas into water, diluting liquid elemental bromine with water in the presence of the acid or salt of the invention, bubbling liquid bromine into water, with or without agitation, and so on. Preferably, the solution is prepared by first dissolving the acid or salt in about 50 cc of water at 40° C. The solution is then cooled to room temperature and the desired quantity of liquid bromine added and stirred until dissolved. The solution can then be diluted to the desired concentration by adding water, preferably deionized water.

As indicated hereinbefore, the surface modification reaction is efficient and easily controlled. For example, the etch rate for a $CuInSe_2$ film immersed in an aqueous solution containing 0.02 mol/l of bromine and 0.13 mol/l KBr at 25° C. was approximately 0.1 micron/minute. The rate for an 0.25 mol/l bromine in water solution was approximately 1.5 micron/minute. The concentration of bromine in the surface treating solution can be adjusted against the etch time to maximize the desired result.

The surface modification can be carried out in any suitable manner in any suitable container under any suitable conditions, either with or without agitation. For example, mild agitation is achieved by moving the film back and forth in a bath once every thirty seconds more or less, or by stirring, or with ultrasonic mixing, or any other suitable technique.

Because the modified films produced by the process of the invention have specular surfaces, such films are particularly useful for producing solar cells. $CuInSe_2$/CdZnS solar cells fabricated from surface modified films of the invention from which 0.1 to 1.5 microns of the average planar film surface is removed had improved or at least comparable overall device performance to as-deposited films. Cells made on etched films of the invention exhibited equivalent or even higher Voc than their unetched counterparts.

Modified films of the invention are particularly suitable for the fabrication of single junction and tandem $CuInSe_2$ solar cells. The smooth surface reduces the junction area and results in an enhanced open circuit voltage. In $CuInSe_2$ modules, the specular surface achieved as a result of the practice of the invention reduces the top contact sheet resistance due to a reduced effective path length across the surface, permitting wider contact grid spacing and reduced shading losses. Such improvement allows larger individual cell areas in a submodule design. In the production of $CuInSe_2$ monolithic tandem cells, the specular $CuInSe_2$ surface favors deposition of a wide gap cell. This is particularly important for $CuInSe_2$/CdS/amorphous silicon tandem cells, where the total thickness of the silicon layers is about 0.5 micron. In addition, uniform thin film anti-reflection coatings may readily be applied to film surfaces modified in accordance with the invention.

Photovoltaic devices such as solar cells, including single junction and monolithic tandem cells, or any other kind of cell made by depositing a semiconductor layer (e.g. CdS) on a base film (e.g. $CuInSe_2$), as provided by this invention, are improved because of the specular nature of the surface of the semiconductor films of the invention. For example, single junction cells such as CdS on a $CuInSe_2$ film of the invention, have efficiencies in the range of 9.5 to 10%. The invention is particularly important for module design in single junction cells.

This result is particularly significant in the production of tandem cells which requires that the base film have a smooth surface as well as the electro-optical properties critical for proper performance. Although semiconductor films such as $CuInSe_2$ can be formed with smooth surfaces as grown, such films do not have the requisite electro-optical properties which make them particularly suitable for the production of photovoltaic devices, particularly monolithic tandem cells. On the other hand, polycrystalline films which do have the proper electro-optical properties cannot be formed with smooth surfaces in the as-grown condition. Indeed, such films, nominally only two to three microns thick, contain protrusions and growth facets which are on the order of one to five microns higher than the average planar surface of the film. As explained hereinbefore, such protrusions carry over through the deposition of subsequent cell layers with the result that a thin amorphous silicon top layer is even thinner at points corresponding to protrusions in the base layer. As a consequence, a tandem cell based on a lower layer containing such protrusions shorts and has undesireable electrical properties on use.

The instant invention provides monolithic tandem cells, particularly those comprising an amorphous silicon p-i-n cell at a thickness of about 0.5 micron on an interconnecting interdiffusion barrier layer covering a layer of a semiconductor such as CdS at thicknesses of from about 0.1 to 3 microns, preferably two microns, which is in turn deposited on a semiconductor base film such as $CuInSe_2$ at thicknesses of from about one to three microns, preferably 1.5 microns, wherein the base film has a texture of less than 0.25 greater than the average planar surface of the base film. Monolithic tandem cells of the invention have demonstrated efficiencies near 6% which proves the efficacy of the invention. Such an efficiency is impossible to achieve chemically and in a single step absent the instant invention since the silicon top layer is too thin to level the irregularities in the second layer which mimes the irregularities in the base film. With the present invention, however, a base film is provided which has a surface polished chemically to a specular condition, the smoothness of which is replicated in subsequent cell layers.

Solar cells of the invention, including single junction and tandem cells, can be fabricated by any suitable technique using any suitable semiconductor films, contacts, and other components and materials such as described, for example, by Birkmire et al. in *High Efficiency $CuInSe_2$ Based Heterojunction Solar Cells: Fabrication and Results*, Solar Cells, 16, 419–427 (1986). Generally, a base film is deposited at any suitable thickness on any suitable substrate such as, for example, glass, preferably metallized or coated with a suitable intermediate layer such as, for example, molybdenum. The film can be deposited by vacuum evaporation from an elemental source, by sputtering from a suitable target, by reaction of a film of one or more elements with the gas of another (e.g. selenization of a CuIn film by exposure to hydrogen selenide gas in a hot oven at (400°–600° C.), by flash evaporation, electrochemical deposition or any other suitable method.

The surface of the as-deposited film is then surface modified as described herein until the texture of the surface is less than 0.25 micron greater than the average planar surface of the film or, stated differently, until a layer of from about 0.1 to 1.5 microns has been removed from the as-grown average planar surface. The thickness of the film is then nominally from about 2.9 to about 1.5 microns.

A second layer, preferably CdS, is deposited on the surface-modified base film by any suitable method such as, for example, by evaporation from CdS powder, preferably at an average thickness of from about 0.1 to three microns. The second layer can be doped to increase its conductivity. For example, indium can be evaporated from an elemental indium source while the substrate is heated at a suitable temperature during the deposition. The sheet resistance of a CdS second layer thus doped has a sheet resistance of from about 0.01 to about 10 ohms-cm, depending on the quantitiy of dopant. In another modification, a different semiconductor can be coevaporated to form the second layer such as ZnS or ZnSe. For example, ZnS can be coevaporated with CdS and doped with indium to give an indium-doped CdZnS film.

Any suitable current-carrying layer such as indium tin oxide (ITO), ZnO and the like and middle terminal for providing robust contact pads such as nickel strips can be deposited between the top and bottom cells, i.e. on the CdS layer, by any suitable method such as sputtering and electron-beam evaporation through a mask, respectively. The current carrying layer generally has a sheet resistance of from about 10 to 20 ohms/▪.

Figure 7:
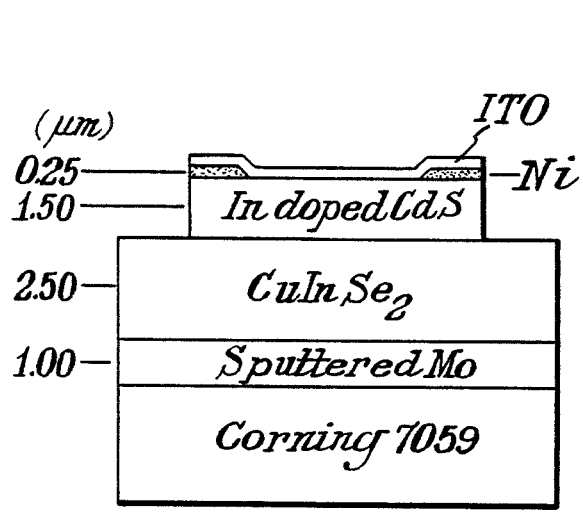
FIG. 7 is a representation of a single junction cell of the invention prepared by the deposition of layers in which the bottom or base layer is polished in accordance with the invention.

Such a construction as illustrated in FIG. 7 can then be divided into individual cells by any known method such as photolithography.

Figure 8:
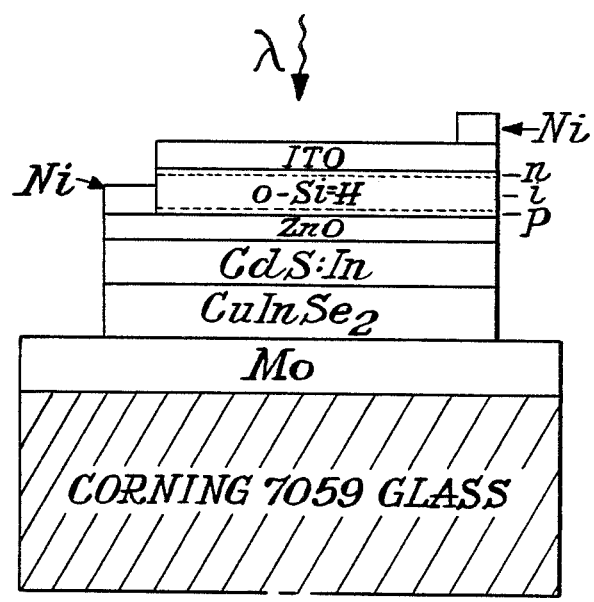
FIG. 8 is a representation of a monolithic tandem cell of the invention prepared by the deposition of layers in which the bottom or base layer is polished in accordance with the invention.

In the construction of a tandem cell, the same procedure is employed followed by deposition of an amorphous p-i-n cell, using any suitable means. Generally, a p-i-n amorphous silicon cell that is 0.5 micron thick is deposited on the layered substrate by any suitable means, preferably by photochemical vapor deposition and a suitable contact layer of any suitable material (e.g. ITO, ZnO and the like) is provided as known in the art, preferably by sputtering. Individual cells are then defined by any suitable means, preferably photolithography. Such a construction is shown in FIG. 8.

The process of the invention can be used to modify the surface of semiconductors for applications other than photovoltaic devices. For example, improved thin film transistors and infrared detectors can be fabricated from films surface-treated as described herein.

The invention is further illustrated but is not intended to be limited by the following examples in which all parts and percentages are by weight unless otherwise indicated.

EXAMPLE 1

Comparative experiments illustrate the dramatic differences achieved when a $CuInSe_2$ film surface is treated with bromine in water versus bromine in methanol under the same conditions. Two $CuInSe_2$-coated substrates are prepared as follows:

A 1×1 inch Corning 7059 glass substrate is ultrasonically cleaned in a soap solution and dried in freon before being coated with a 2 micron thick layer of molybdenum applied by sputtering from a molybdenum target. The metallized substrate is ultrasonically cleaned in a soap solution, dried in freon, and weighed to establish a basis for determining film thickness by mass-gain.

The cleaned substrate is then loaded into a three-source elemental $CuInSe_2$ evaporator and the chamber is pumped down to a pressure of $1 \times 10^{-6}$ torr. Cu, In, and Se are evaporated from the elements in heated boron-nitride source bottles. A $CuInSe_2$ film is deposited in two stages. The first 1.5 microns of thickness are deposited with the substrate held at a temperature of about 350° C., with the copper and indium fluxes adjusted to give a copper-rich film. The substrate temperature is then raised to about 450° C. and the fluxes are adjusted to give an indium-rich layer. The composite layer which results is shown in FIG. 1 and contains Cu:In:Se in the proportions 24:26:50. The substrate re-weighed to determine mass-gain indicates that the film thickness is nominally 3 microns.

An aqueous solution of bromine in water is prepared by first dissolving 15 grams of KBr in 50 cc of de-ionized water at 40° C. The solution is cooled to 30° C. and 0.05 cc of liquid bromine are added and stirred until they disappears as a separate phase liquid. The resulting solution is diluted with an additional 50 cc of de-ionized water to yield a concentration of 0.02 mol/l bromine in water.

A solution of bromine in methanol is prepared by adding 0.05 cc of liquid bromine to 100 cc of methanol at 25° to 30° C. The solution is stirred until the bromine disappears as a separate phase liquid.

One $CuInSe_2$ coated substrate is exposed to the aqueous solution by immersion in about 100 cc of the aqueous solution contained in a beaker. Another $CuInSe_2$ coated substrate is exposed to the methanol solution by immersion in about 100 of the methanol solution contained in a beaker. In each case one micron of effective film thickness is removed as determined by mass lost from the substrate (etch/weigh until the prescribed amount is removed), about 6 minutes for the aqueous solution and about 8 minutes for the methanol solution. After the immersion, the samples are rinsed for 20 seconds in the solvent used to carry the bromine (i.e., water and methanol) for the specific solution used.

FIGS. 2 and 3 show that the surface of the sample etched in the methanol based solution is not smooth and appears to have been irregularly attacked by the solution.

FIGS. 4 and 5 show that the surface of the sample etched in the aqueous soluton is smooth and free from etch pits with a texture of less than 0.25 micron greater than the average planar surface. Front surface reflection measurements confirm the results shown in the figures since the sample etched in the aqueous solution has a higher specular reflection component as indicated in Table 2.

TABLE 2

| | Front Surface Reflection Results | | |
| | | Reflection (%) | |
| Etchant | Total | Diffuse | Specular |
| --- | --- | --- | --- |
| Aqueous | 16.5 | 7.9 | 8.6 |
| Methanol | 16.4 | 12.0 | 4.4 |

Figure 6:
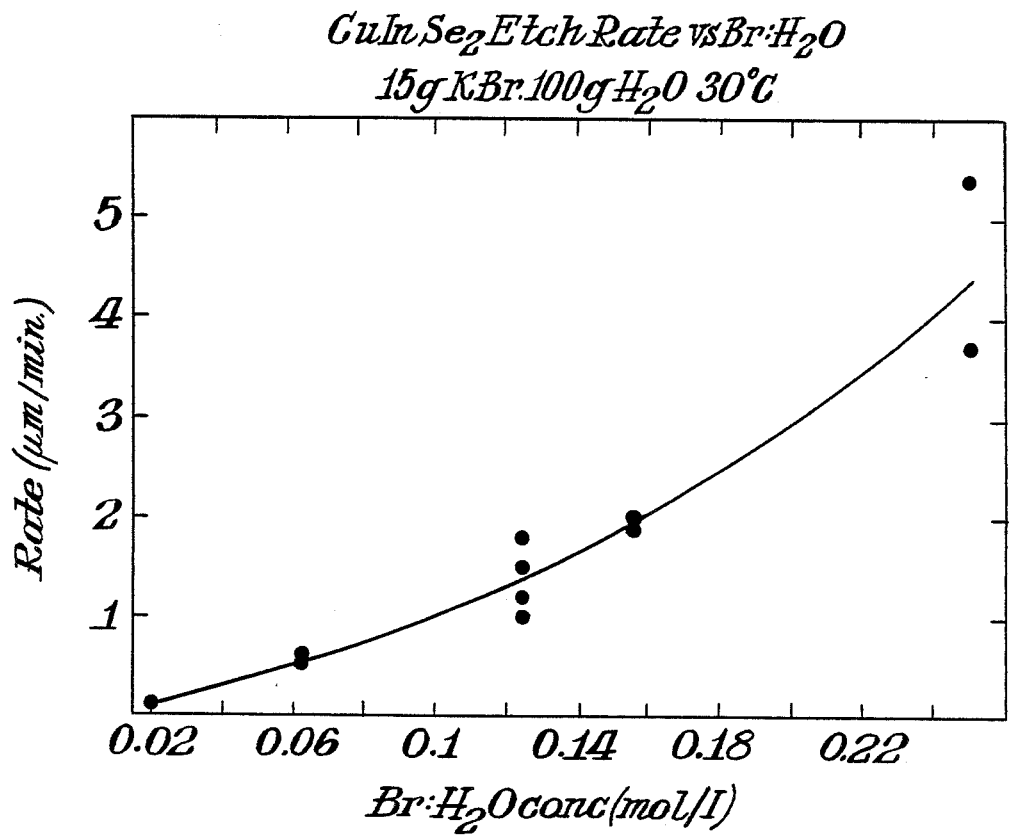
FIG. 6 is a plot of etch rate versus quantity of bromine dissolved in water for the $CuInSe_2$ film of Example 1.

FIG. 6 plots etch rate versus concentration (mol/l) of bromine in water for the $CuInSe_2$ film contained on a substrate as described above. As the plot shows, the etching reaction is easily controlled by simply varying the concentration of bromine in the aqueous solution against etch time. The Figure also shows that even very small concentrations of bromine are operative as are saturation concentrations. Excellent results are obtained in every case and $CuInSe_2$ films having a specular surface result.

EXAMPLE 2

A single junction solar cell is prepared beginning with a substrate coated as described in Example 1 and surface-modified with the aqueous bromine solution. The substrate is heated to about 200° C. during deposition of a CdS layer by evaporation from CdS powder packed into a Knudsen-type effusion source. An elemental indium source is also used to evaporate an amount of In sufficient to dope the Cds film and increase its conductivity. The CdS film has a thickness of 2 microns and a resistivity of about 0.1 ohm-cm.

A film of indium tin oxide (ITO) is sputter-deposited onto the CdS at a thickness of 2000 Å to provide current-carrying capacity. The ITO film has a sheet resistance of 20 ohms/▪.

The ITO surface is masked with a suitable resist and nickel strips are deposited by electron-beam evaporation through the mask to provide robust contact pads for testing the cell.

A positive resist is deposited on the coated substrated and to register a cell pattern and photolithography is used to divide the coated substrate into twelve cells, each having an area of about 0.1 cm$^2$. The nickel strips are etched in nickel etchant and the ITO/CdS is etched in a solution of 70% HCl. The photoresist is then stripped with a conventional resist remover.

A second single junction cell is similarly prepared from the substrate etched with bromine/methanol as described in Example 1. Five aqueous and six methanol etched cells provide the data contained in Table 3 for open circuit voltage, short circuit current and fill factor. As the Table shows, the range of open circuit voltage (Voc), short circuit current (Jsc) and fill factor (FF) is very small for the aqueous bromine etched cells, indicating good uniformity. By contrast, the open circuit voltage and fill factor ranges for methanol/bromine etched cells are broad, indicating poor uniformity. In addition, the open circuit voltages and fill factors are consistently lower for cells prepared from substrates etched with methanol/bromine than for cells prepared from the the aqueous bromine etched substrates.

TABLE 3

Solar Cell Uniformity Measurement Results
ELH 87.5 mW/cm$^2$ simulation at 32° C.

| Aqueous | | | Methanol | | |
| --- | --- | --- | --- | --- | --- |
| Voc (v) | Jsc (mA/cm$^2$) | FF (%) | Voc (v) | Jsc (mA/cm$^2$) | FF (%) |
| 0.41 | 29.4 | 62.1 | 0.37 | 29.2 | 57.1 |
| 0.41 | 28.6 | 62.6 | 0.38 | 28.4 | 58.1 |
| 0.42 | 29.6 | 64.6 | 0.15 | 27.9 | 30.3 |
| 0.41 | 27.9 | 63.1 | 0.39 | 29.5 | 61.6 |
| 0.41 | 28.8 | 64.2 | 0.40 | 29.1 | 62.5 |
| | | | 0.40 | 29.6 | 62.1 |

EXAMPLE 3

A tandem cell is prepared from a substrate prepared as described in Example 1 and surface modified with the aqueous bromine solution. A CdS layer is deposited on the substrate as described in Example 2 wherein the CuInSe$_2$ film is etched with the aqueous bromine solution described in Example 1 to remove about 0.9 micron of CuInSe$_2$ film (about 9 minutes). After the CdS is deposited, the substrate is heat treated in air at about 200° C. for about 24 hours to optimize performance of the CuInSe$_2$/CdS cell.

Nickel strips are deposited as in Example 2 to provide a middle terminal between the top and bottom cells. ITO is deposited as in Example 2 to act as a current-carrying layer for testing component cells and as a diffusion barrier between the two cells. The substrate is then heated in flowing oxygen at about 200° C. for about 30 hours to bake out hydrocarbon impurities.

The substrate is loaded into an amorphous silicon (a-Si:H) reactor which is evacuated and heated to about 250° C. for about 14 hours. Vapor phase contamination in the reactor is monitored by residual gas analysis (RGA). A p-i-n amorphous silicon solar cell is deposited on the substrate by photochemical vapor deposition. The substrate is then removed from the reactor and an ITO contact layer and second set of nickel strips are deposited as described in Example 2 to provide robust contact to the a-Si:H cell.

Photolithography is used to define twelve small cells as described in Example 2 with the a-Si:H being etched with XeF2 vapor at 1 to 3 torr. The middle contact is revealed at this point and must be protected with an additional photoresist layer. Etching continued using 100% HCl for ITO and CdS and etching the nickel with a nickel etchant. The photoresist is then stripped conventionally.

The tandem cell of this example is the first working cell of this design to be fabricated. It has an efficiency near 6% (5.8%) and could not be made without the practice of the invention because such a cell requires the CuInSe$_2$ layer to have a specular surface as well as the electro-optical properties critical for proper functioning. Before this invention, it was possible to fulfill one or the other of these requirements but not both.

Although the invention has been described in considerable detail in the foregoing, it is to be understood that such detail is solely for the purpose of illustration and is not intended to limit the invention. Other embodiments operate similarly to the preferred embodiments used for the purpose of illustration in the examples. Variations can be made by those skilled in the art without departing from the spirit and scope of the invention except as set forth in the claims.

What is claimed is:

1. A process for providing a specular surface on a semiconductor film composed of group I-III-VI or II-VI elements which comprises exposing the film surface to an aqueous solution containing bromine and an acid or salt or mixtures thereof, and continuing such exposure for a time sufficient to polish the surface of the film.

2. The process of claim 1 wherein the pH of the aqueous solution is about 9.5 or lower.

3. The process of claim 2 wherein the pH of the aqueous solution is about 2.5 to 7.

4. The process of claim 3 wherein the salt is an alkali metal, alkaline earth metal, or heavy metal salt or mixture thereof.

5. The process of claim 4 wherein the aqueous solution contains bromine at a concentration of from about 0.02 mol/l to saturation.

6. The process of claim 4 wherein the concentration of bromine in the aqueous solution is from about 0.02 to 0.25 mol/l.

7. The process of claim 3 wherein the concentration of the acid in the aqueous solution is at least about 0.01 mol/l.

8. The process of claim 3 wherein the concentration of the acid is from about 0.05 mol/l to 0.15 mol/l.

9. The process of claim 8 wherein the acid is hydrogen bromide or hydrogen chloride.

10. The process of claim 3 wherein the concentration of the salt in the aqueous solution is at least about 0.01 mol/l.

11. The process of claim 10 wherein the concentration of the salt in the aqueous solution is from about 0.05 mol/l to saturation.

12. The process of claim 11 wherein the concentration of the salt in the aqueous solution is from about 0.05 mol/l to 0.15 mol/l.

13. The process of claim 12 wherein the salt is an alkali metal, alkaline earth metal, or heavy metal salt.

14. The process of claim 13 wherein the salt is an alkali metal or alkaline earth metal salt.

15. The process of claim 14 wherein the anion of the salt is chlorine or bromine.

16. The process of claim 15 wherein the salt is sodium chloride or potassium bromide.

17. The process of claim 3 wherein the specular surface on the semiconductor film has a texture of less than 0.25 micron greater than the average planar surface of the film.

18. The process of claim 1 wherein the semiconductor is a polycrystalline thin film.

19. The process of claim 1 wherein the semiconductor film contains Cu, In, Se, Cd, S, Zn, and mixtures thereof.

20. The process of claim 18 wherein the film is $CuInSe_2$ or CdTe.

21. A process for providing a specular surface having a texture of less than about 0.25 micron greater than the average planar surface of a 3 micron thick $CuInSe_2$ film which comprises immersing the film in an aqueous solution of 0.02 mol/l of bromine and 0.13 mol/l KBr and mildly agitating the solution until 1.5 microns of the thickness is removed.

22. A polycrystalline thin film semiconductor having a specular surface and a texture of less than about 0.25 micron greater than the average planar surface of the film prepared by exposing a polycrystalline film surface to an aqueous solution of bromine and an acid or salt or mixture thereof and continuing such exposure until from about 0.1 to 1.5 micron of the average planar surface of the film is removed.

23. The film of claim 22 composed of group I-III-VI, III-V, and II-VI elements.

24. The film of claim 23 containing Cu, In, Se, Cd, S, Zn, and mixtures thereof.

25. The film of claim 24 comprising $CuInSe_2$ or CdTe.

26. The film of claim 22 wherein the pH of the aqueous solution is about 9.5 or less.

27. The film of claim 26 wherein the pH of the aqueous solution is about 2.5 to 7.

28. The film of claim 27 wherein the salt is an alkali metal, alkaline earth metal, or heavy metal salt or mixture thereof.

29. The film of claim 28 wherein the aqueous solution contains bromine at a concentration of from about 0.02 mol/l to saturation.

30. The film of claim 29 wherein the concentration of bromine in the aqueous solution is from about 0.02 to 0.25 mol/l.

31. The film of claim 27 wherein the concentration of the acid in the aqueous solution is at least about 0.01 mol/l.

32. The film of claim 31 wherein the concentration of the acid is from about 0.05 mol/l to 0.15 mol/l.

33. The film of claim 32 wherein the acid is hydrogen bromide or hydrogen chloride.

34. The film of claim 28 wherein the concentration of the salt in the aqueous solution is at least about 0.01 mol/l.

35. The film of claim 34 wherein the concentration of the salt in the aqueous solution is from about 0.05 mol/l to saturation.

36. The film of claim 35 wherein the concentration of the salt in the aqueous solution is from about 0.05 mol/l to 0.15 mol/l.

37. The film of claim 28 wherein the salt is an alkali metal or alkaline earth metal salt.

38. The film of claim 37 wherein the anion of the salt is chlorine or bromine.

39. The film of claim 38 wherein the salt is sodium chloride or potassium bromide.

* * * * *